United States Patent [19]

Scoccia et al.

[11] Patent Number: 4,533,189

[45] Date of Patent: Aug. 6, 1985

[54] ZERO INSERTION FORCE CONNECTOR

[75] Inventors: Adelmo A. Scoccia, Upland, Calif.; Donald B. Schellin, deceased, late of Crestline, Calif., by Gene Downes, administrator

[73] Assignee: General Dynamics Pomona Division, Pomona, Calif.

[21] Appl. No.: 544,157

[22] Filed: Oct. 21, 1983

[51] Int. Cl.$^3$ .................. H05K 1/00; H01R 13/629

[52] U.S. Cl. .................. 339/17 CF; 339/66 M; 339/74 R; 339/75 MP; 339/108 R

[58] Field of Search .......... 339/17 CF, 74 R, 75 M, 339/176 M, 17 L, 17 LC, 17 LM, 75 MP, 176 MP, 65, 66 M, 108 R, 110 R, 110 P, 17 N, 17 C, 255 R, 255 P, 76, 77, 79

[56] References Cited

U.S. PATENT DOCUMENTS

| | | | |
|---|---|---|---|
| 2,261,761 | 11/1941 | Hanson et al. | 339/76 X |
| 2,733,416 | 1/1956 | Evalt | 339/82 X |
| 2,760,173 | 8/1956 | Cunningham | 339/76 |
| 2,802,188 | 8/1957 | Badders | 339/254 M |
| 3,130,351 | 4/1964 | Giel | 339/74 R |
| 3,188,598 | 6/1965 | Pferd | 339/74 R |
| 3,366,916 | 1/1968 | Oktay | 339/74 R |
| 3,391,383 | 7/1968 | Antes | 339/17 CF X |
| 3,534,324 | 10/1970 | Dorn | 339/254 M |
| 3,576,515 | 4/1971 | Frantz | 339/74 R |
| 3,611,259 | 10/1971 | Palecek | 339/74 R |
| 3,614,707 | 10/1971 | Kaufmann | 339/176 MP X |
| 3,820,054 | 6/1974 | Clewes et al. | 339/17 CF |
| 3,899,234 | 8/1975 | Yeager et al. | 339/75 MP X |
| 3,997,227 | 12/1976 | Cutchaw | 339/75 MP X |
| 4,077,688 | 3/1978 | Cobaugh et al. | 339/74 R |
| 4,148,537 | 4/1979 | Sochor | 339/74 R |
| 4,327,955 | 5/1982 | Minter | 339/75 MP X |
| 4,381,131 | 4/1983 | Demnianiuk | 339/75 M |
| 4,437,718 | 3/1984 | Selinko | 339/17 CF X |

FOREIGN PATENT DOCUMENTS

| | | | |
|---|---|---|---|
| 812970 | 5/1969 | Canada | 339/17 C |

OTHER PUBLICATIONS (Author unknown)—PC Card Retainer, Aug., 1982—Electronic Packaging and Production—pp. 101, 102.

(Author unknown)—Zero-Insertion-Force Sockets Cut Costs—8/23/82—Design News, p. 58.

*Primary Examiner*—Gil Weidenfeld
*Assistant Examiner*—Steven C. Bishop
*Attorney, Agent, or Firm*—Neil F. Martin; Edward B. Johnson

[57] ABSTRACT

A zero insertion force electrical connector for multiple electrical connections includes a circuit board having a pair of contact strips on opposite faces thereof with opposed clamp members disposed adjacent the contact strips for biasing connector pins into engagement with the strips and a second connector member having a plurality of lined pins disposed for positioning on each side of the board adjacent the connector strips for contacting the connector strips upon biasing by the clamp members into engagement therewith.

9 Claims, 11 Drawing Figures

ZERO INSERTION FORCE CONNECTOR

The U.S. Government has rights in this invention pursuant to Contract No. DAAK40-77-C-0122, awarded by the U.S. Army.

BACKGROUND OF THE INVENTION

The present invention relates to electrical connectors and pertains particularly to a zero insertion force electrical connector.

Multiple pin connectors wherein an electrical pin is inserted into a receptacle having a contact which engages the pin for making electrical contact require certain minimum amount of pressure to maintain engagement and assure that electrical contact is maintained. It is desirable in most instances to maintain a certain minimum force, yet this force is objectionable during the attempt to insert or remove the electrical connector pins. The force causes a wearing of the pins and the contact surfaces thereof as well as requires a force that may tend to bend or otherwise displace the pins.

Certain connectors have been developed for reducing the insertion force necessary for insertion of printed circuit boards into multiple contact sockets. Various structures have been proposed in the prior art for accomplishing a substantial elimination of the insertion force, yet establishing a necessary contact force. These however are not satisfactory for use where contact pins are being inserted into the connector receptacle.

The increasing miniaturization of electronic circuits and systems results in similar miniaturization of the wiring leads and components including connector pins. It is desirable in many instances to have extremely thin or small contact pins for connectors. It is necessary or desirable in such instances to have means for eliminating the insertion force of the pins.

SUMMARY AND OBJECTS OF THE INVENTION

It is the primary object of the present invention to provide an improved zero insertion force multiple pin electrical connector.

In accordance with the primary aspect of the present invention, a multiple pin connector assembly includes a first connector member having dual in line connector pins and a second connector member having a central support member with a plurality of oppositely directed aligned longitudinally positioned contacts for engagement by the connector pins and adjacent clamp means for selectively engaging and biasing the pins into engagement with the contacts with means for releasing the clamping means for eliminating the force of insertion of the connector pins.

BRIEF DESCRIPTION OF THE DRAWINGS

The above and other objects and advantages of the present invention will become apparent from the following description when read in conjunction with the drawings wherein.

DETAILED DESCRIPTION OF A PREFERRED EMBODIMENT

Figure 1:
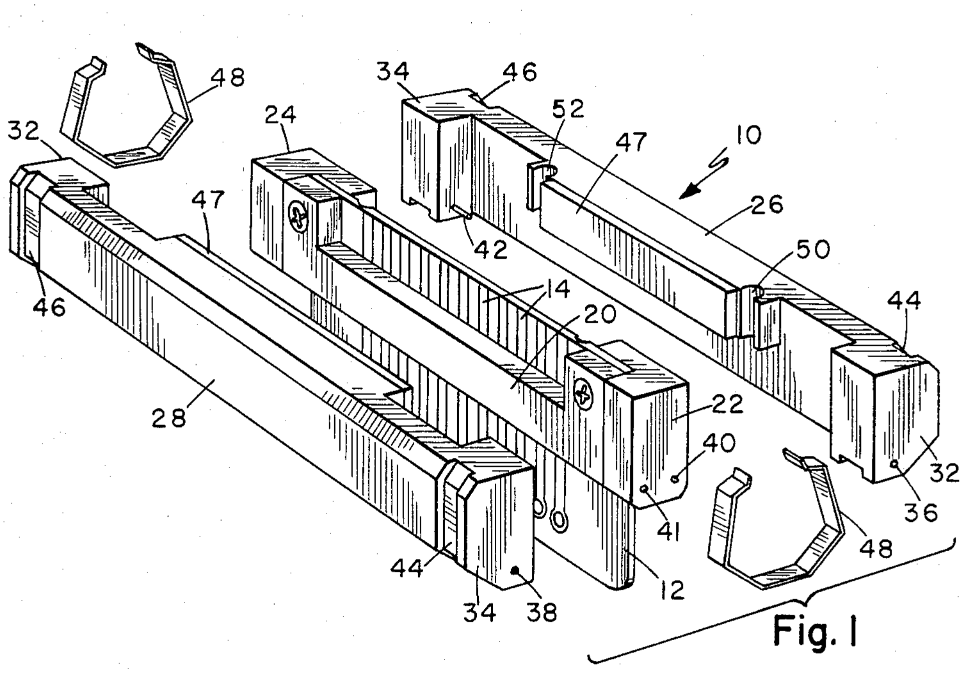
FIG. 1 is an exploded perspective view of the connector.
Figure 6:
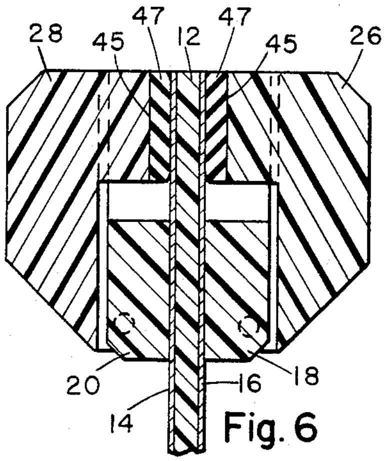
FIG. 6 is an enlarged sectional view taken on line 6—6 of FIG. 2.
Figure 7:
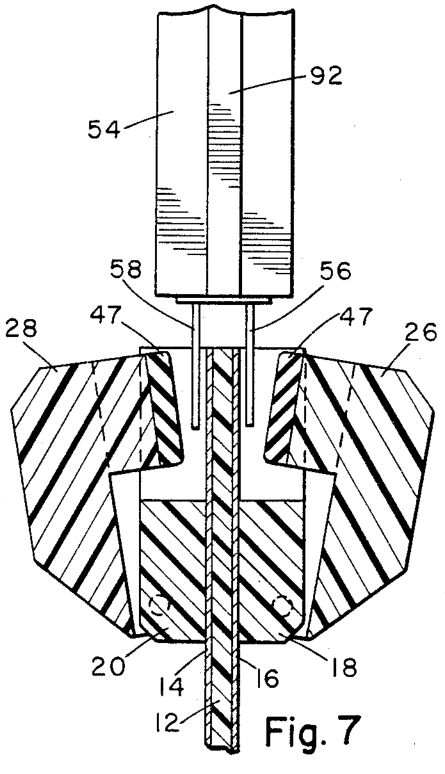
FIG. 7 is a view similar to FIG. 6 with a connector open and an electronic device partially inserted.
Figure 8:
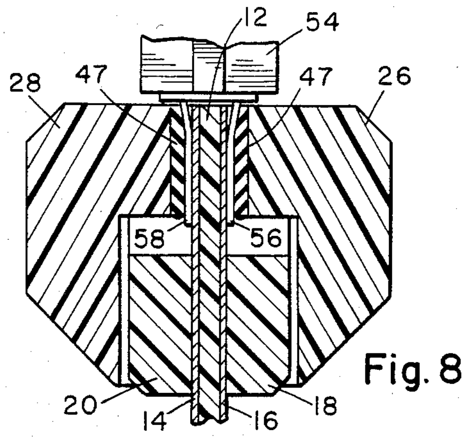
FIG. 8 is a view similar to FIG. 6 with the electronic device held in place.

Referring to FIG. 1 of the drawing, a conductor assembly in accordance with the invention, designated generally by the numeral 10, is illustrated. In the illustrated embodiment, a printed wiring board or circuit board 12 of somewhat conventional construction is constructed of a panel of nonconductive material having a plurality of circuit connectors or pads and a plurality of conductive strips or paths extending up to and terminating in contact pads 14 at one edge on one side of the board and a plurality of similar conductive paths on the opposite side of the board as shown in FIGS. 6–8 similarly extending to and terminating in contact pads 16 near the opposite end of the board.

A pair of housing support members 18 and 20 having an elongated generally U-shaped configuration are secured to and clamp wiring board 12 therebetween adjacent the edge of the board by the terminal pads. These housing support members 18 and 20 each have a downwardly or inwardly depending cutout portion leaving the terminal strips 14 and 16 exposed for contact. The housing member 18 includes end portions or members 22 and 24 overlapping the ends of the board 12 and the ends of the housing support member 20, and provides hinge support structure for a pair of terminal clamp members 26 and 28 which are pivotally mounted thereto.

Both of the clamp members 26 and 28 are substantially identical except for guide bores formed in one of the clamp members 26. Only one of the clamp members 26 and 28 will be described in detail with like reference numerals designating like elements of each clamp member, it being understood that the other member is substantially identical. The clamp member 26 includes end hinge bracket members 32 and 34 that overlap the ends 22 and 24 of the central support member 22 and includes aligned bores 36 and 38 that align with bores 40 and 41 on the end members 22 and 24 for receiving pivot pins 42 and 43, for pivotally mounting the clamp member at the bottom edge thereof to the bottom edge of the respective support members 22 and 24. The clamp members each include a central inwardly extending elongated jaw member having a generally flat planar surface 45 for supporting an elastic or resilient pad 47 for engaging the contact pins to be biased into engagement with the respective contact pads 14 and 16. The resilient pads 47 on the faces of the jaws 26 and 28 ensure that sufficient force will be biased against the respective pins to be described to bias them into contact with the contact strips or pads 14 and 16. A pair of guide bores 50 and 52 are formed at the ends of the clamp jaw face 36 of the member 26 which guide bores are partially formed in the circuit or wiring board 12 for receiving guide pins as will be subsequently described.

A pair of grooves 44 and 46 are formed at each end of the clamp members 26 and 28 for receiving generally C-shaped spring members 48 which encircles both clamp members for biasing them to the clamped position toward the contact strip pads 14 and 16.

Figure 2:
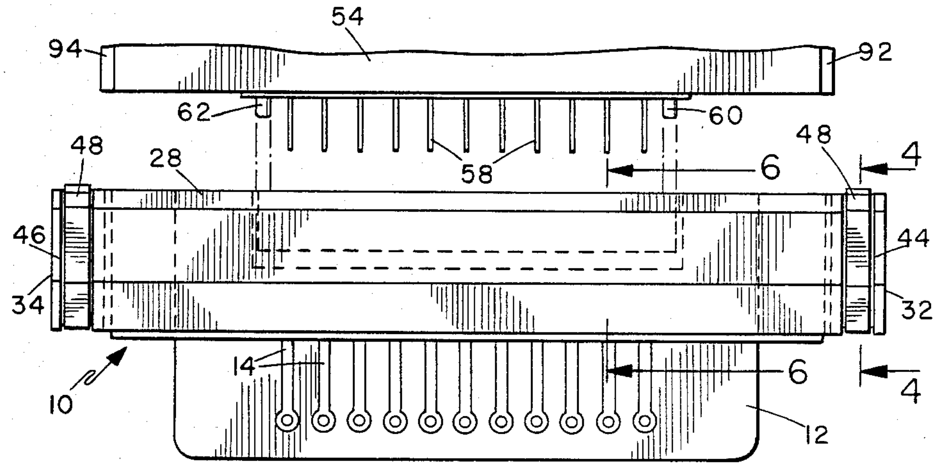
FIG. 2 is a side elevation view of the connector with an electronic device in position for insertion.
Figure 3:
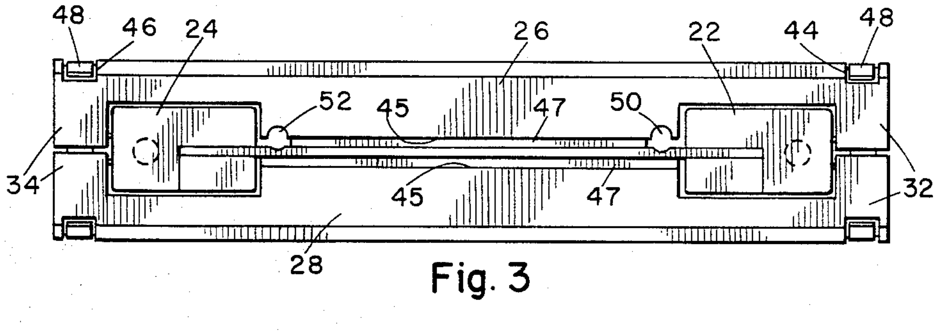
FIG. 3 is a top plan view of the connector.
Figure 4:
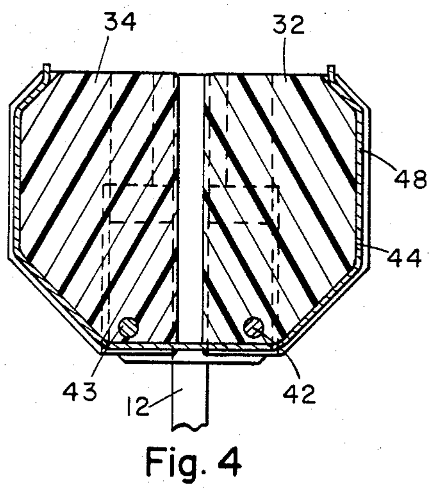
FIG. 4 is an enlarged sectional view taken on line 4—4 of FIG. 2.

A pin connector member as shown in FIGS. 2, 7 and 8 comprises a support block 54 having a plurality of contact pins extending downward therefrom in parallel aligned rows of pins 56 and 58. In the illustrated embodiment the connector member includes dual inline pins 56 and 58 that project downward and are spaced apart sufficiently to straddle to each side of the board 12 in line with the corresponding contact strip pads 14 and 16 without direct engagement therewith. The pins are then engaged by the pressure pads 47 on the clamp members 26 and 28 and biased inward into contacting engagement with the respective contact strip pads 14 and 16. The pin connector member 54 includes a pair of guide pins 60 and 62 extending downward parallel to the connector pins 56 and 58 for engaging guide bores 50 and 52 formed in the clamp member 26 and board 12. These guide pins and guide bores position and align the connectors such that the contact pins 56 and 58 are positioned for proper contact.

Figure 5:
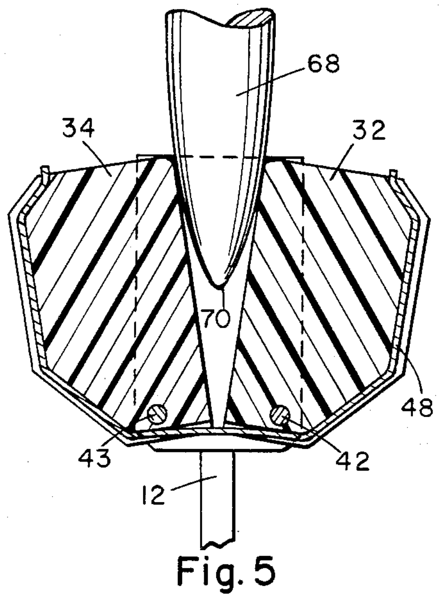
FIG. 5 is a view similar to FIG. 4 showing the connector opened by an insertion tool.

The clamp members 26 and 28 are biased open to the open position as shown in FIG. 5 by means of an insertion tool 68 having a pointed tip 70 forming essentially a cam that extends into and between the two clamp members 26 and 28 at the ends thereof for biasing or camming the clamp members 26 and 28 to the open position as shown in FIG. 7 for permitting the pin connector to extend downward with the lines of pins 56 and 58 astride the board member so that the contacts are positioned for engagement with the contact pads 14 and 16. The insertion tool 68 is then removed permitting the clamp members 26 and 28 to close as shown in FIG. 8 biasing the dual lines of contact pins 56 and 58 into engagement with the dual lines of contact pads 14 and 16.

This permits the clamping of substantially any size or configuration of pins or contacts into engagement with contact pads or strips on a circuit board. The contact pins can be of such thin cross section and of such minimal strength that no actual force can be tolerated thereby yet the pins can be accommodated in the present device. This permits the use of micropins on the order of 0.018 of an inch to be utilized. This permits minimum space to be utilized for the necessary contacts.

Figure 9:
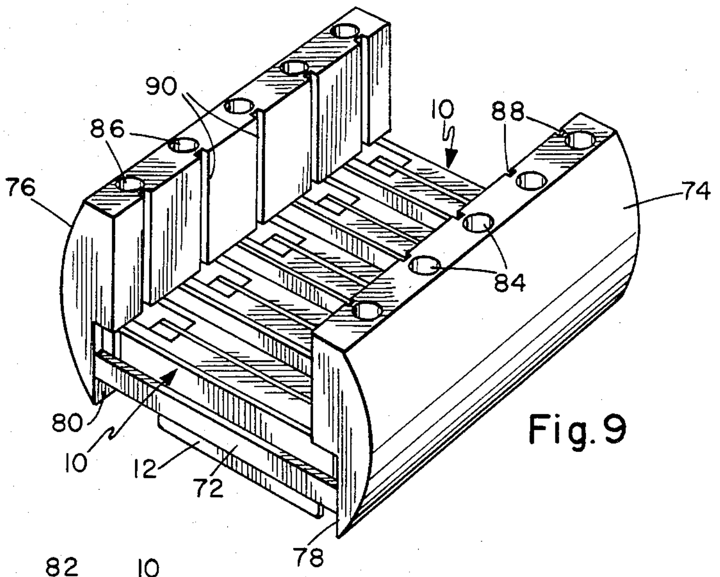
FIG. 9 is a perspective view of a typical support structure having guide means for guiding electronic devices into multiple connectors held in a structure.
Figure 10:
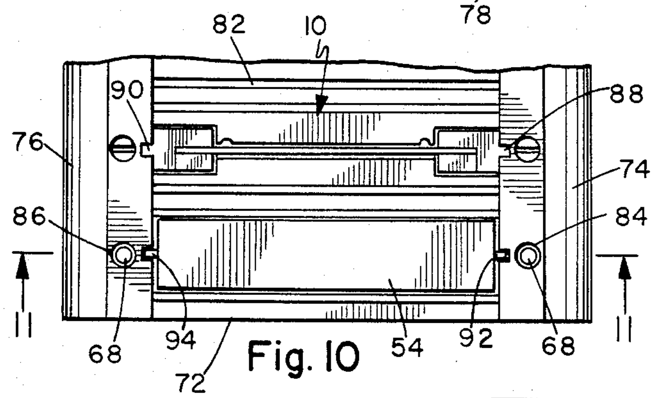
FIG. 10 is a partial top plan view of a support structure with an electronic device in the guide means above the connector.
Figure 11:
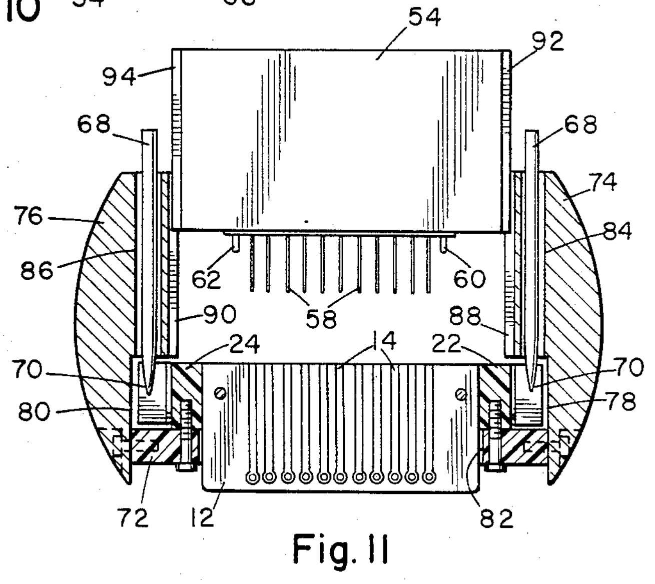
FIG. 11 is a sectional view taken on line 11—11 of FIG. 10.

The connectors can be mounted in a housing assembly of a plurality of connector receptacles for accommodating a plurality of connector plug or pin connector assemblies as shown in FIGS. 9–11. This arrangement includes a housing having a bottom 72 and a pair of vertical side walls 74 and 76 having recessed grooves 78 and 80 for receiving the ends of the receptacle connectors and mounting the connectors therein. The bottom 72 includes a plurality of slots 82 through which the boards 12 pass or extend. A plurality of insertion tool bores 84 and 86 for aligning the insertion tools 68 and permitting alignment of and engagement of insertion tools 68 into the space between adjacent jaws 26 and 28 for opening the jaws are provided in the vertical walls. A plurality of vertical guide slots 88 and 90 align the pin connector member 54 having guide flange portions 92 and 94 engageable with the guide slots 88 and 90 for guiding the pin connector into proper positional relationship with the contact pads.

With the above arrangement, substantially any size or form of contact pins can be accommodated.

While we have illustrated and described our invention by means of a specific embodiment, it is to be understood that numerous changes and modifications may be made therein without departing from the spirit and scope of the invention as defined in the appended claims.

What is claimed is:

1. A zero force multiple pin electrical connector, said connector comprising:
   - a first connector member including a central planar support member having a plurality of contacts aligned along at least one surface thereof;
   - opposed clamping means disposed adjacent said contacts and spring-biased toward said contacts for biasing connector pins into engagement with the contacts;
   - a second connector member having a plurality of aligned pins for engagement with said plurality of contacts; and
   - means for enabling the clamping means to be wedged apart by the insertion of a separate tool to thereby enable placement of said plurality of aligned pins adjacent the contacts;
   - wherein said support member is a printed circuit wiring board and said plurality of contacts comprises contact strips disposed adjacent to one edge of said board.

2. The multiple pin electrical connector of claim 1 when said first connector member includes a support housing attached to said printed circuit board and said clamp member comprises a clamping jaw pivotally mounted on said support member.

3. The multiple pin electrical connector of claim 2 wherein said printed wiring board includes a plurality of connector strips disposed on opposite faces thereof, said second connector member includes first and second rows of aligned pins for positioning on both sides of said board adjacent said connectors.

4. The multiple pin electrical connector assembly of claim 3 wherein said clamping means includes a pair of opposed jaw members pivotally mounted on said support housing and including spring means biasing said jaws toward and into an engagement with said contact strips.

5. The multiple pin connector assembly of claim 4 including guiding means for guiding said second connector member into proper position relative to said first connector member.

6. The multiple pin connector assembly of claim 5 wherein said guide means comprises a pair of spaced apart pins for engaging a pair of cooperating bores on said second connector member.

7. The multiple pin connector assembly of claim 5 wherein said guide means comprises a pair of slots and said second connector member includes means for guidably engaging said slots.

8. The electrical connector assembly of claim 7 wherein said clamping means includes a pair of spaced apart C-springs partially surrounding said clamping jaw members.

9. The multiple pin connector assembly of claim 4 when said plurality of contact pins are no greater than 0.018 inches in diameter.

* * * * *